(12) United States Patent
Kong et al.

(10) Patent No.: US 11,856,878 B2
(45) Date of Patent: Dec. 26, 2023

(54) HIGH-DENSITY RESISTIVE RANDOM-ACCESS MEMORY ARRAY WITH SELF-ALIGNED BOTTOM ELECTRODE CONTACT

(71) Applicant: International Business Machines Corporation, Armonk, NY (US)

(72) Inventors: Dexin Kong, Redmond, WA (US); Ekmini Anuja De Silva, Slingerlands, NY (US); Ashim Dutta, Clifton Park, NY (US); Daniel Schmidt, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 272 days.

(21) Appl. No.: 17/453,841

(22) Filed: Nov. 6, 2021

(65) Prior Publication Data
US 2023/0147958 A1    May 11, 2023

(51) Int. Cl.
    *H10N 70/00*     (2023.01)
    *H10B 63/00*     (2023.01)
    *H10N 70/20*     (2023.01)

(52) U.S. Cl.
CPC ........... *H10N 70/841* (2023.02); *H10B 63/80* (2023.02); *H10N 70/063* (2023.02); *H10N 70/24* (2023.02); *H10N 70/826* (2023.02)

(58) Field of Classification Search
CPC ..... H10N 70/841; H10N 70/063; H10B 63/80
See application file for complete search history.

(56) References Cited

U.S. PATENT DOCUMENTS

| | | | |
|---|---|---|---|
| 6,686,263 B1 | 2/2004 | Lopatin |
| 7,407,858 B2 | 8/2008 | Li |
| 7,833,898 B2 | 11/2010 | Lee |
| 8,241,944 B2 | 8/2012 | Greeley |
| 9,112,144 B2 | 8/2015 | Lee |
| 9,577,009 B1 | 2/2017 | Shih |
| 9,680,095 B2 | 6/2017 | Chen |
| 9,847,482 B2 | 12/2017 | Cho |
| 10,700,281 B2 | 6/2020 | Wang |
| 2008/0090307 A1 | 4/2008 | Xiao |
| 2010/0311243 A1 | 12/2010 | Mao |

(Continued)

OTHER PUBLICATIONS

"Bottom Electrode Formation at Fat Wire Level with Cu Hillock Prevention for AI Application Devices", An IP.com Prior Art Database Technical Disclosure, Disclosed Anonymously, IP.com No. IPCOM000265516D, IP.com Electronic Publication Date: Apr. 20, 2021, 4 pages.

(Continued)

*Primary Examiner* — Marvin Payen
(74) *Attorney, Agent, or Firm* — Michael A. Petrocelli

(57) ABSTRACT

A high-density resistive random-access memory array with self-aligned bottom electrode contact includes a plurality of electrically conductive structures embedded in an interconnect dielectric material layer, a bottom electrode selectively grown over, and electrically connected to, each of the electrically conductive structures with the bottom electrode above an electrically conductive structure being separated from the bottom electrode above another electrically conductive structure by a first dielectric filling layer, the bottom electrode having a semi-circular shape. The array further includes a resistive random-access memory pillar disposed above the bottom electrode.

19 Claims, 3 Drawing Sheets

(56) References Cited

U.S. PATENT DOCUMENTS

2012/0241710 A1  9/2012  Liu
2020/0287136 A1  9/2020  Li

OTHER PUBLICATIONS

"Method and Structure for Back-End-of-Line (BEOL) Fat Wire Level Ground Rule Compatible Embedded Memory Integration", An IP.com Prior Art Database Technical Disclosure, Disclosed Anonymously, IP.com No. IPCOM000259732D, IP.com Electronic Publication Date: Sep. 11, 2019, 6 pages.

"Method and Structure to Make Gap Fill Friendly Tall Bottom Electrode for BEOL AI Memory Device Application", An IP.com Prior Art Database Technical Disclosure, Disclosed Anonymously, IP.com No. IPCOM000263879D, IP.com Electronic Publication Date: Oct. 14, 2020, 6 pages.

"Process-Induced Forming of RRAM Device with Dummy CMP Structure", An IP.com Prior Art Database Technical Disclosure, Disclosed Anonymously, IP.com No. IPCOM000263964D, IP.com Electronic Publication Date: Oct. 27, 2020, 11 pages.

HIGH-DENSITY RESISTIVE RANDOM-ACCESS MEMORY ARRAY WITH SELF-ALIGNED BOTTOM ELECTRODE CONTACT

BACKGROUND

The present invention generally relates to the field of magnetic storage devices, and more particularly to high performance resistive random-access memory devices.

As conventional charge-based memory devices are reaching their physical limits because of their increasing integration density, potential candidates for the next-generation nonvolatile memories are being extensively investigated to provide hardware support for big data, artificial intelligence, and Internet-of-Things (IoT). Resistive random-access memory (RRAM) is one of the most promising candidates because of its low operating voltage, fast read/write speed, long retention time, and high scalability. However, the use of conventional contact formation techniques to form the RRAM's bottom electrode can hinder the formation of high-density RRAM arrays. Therefore, improved designs and techniques for the formation of high-density RRAM devices would be desirable.

SUMMARY

According to an embodiment of the present disclosure, a memory device includes a plurality of electrically conductive structures embedded in an interconnect dielectric material layer, a bottom electrode selectively grown over, and electrically connected to, each of the electrically conductive structures, the bottom electrode above an electrically conductive structure being separated from the bottom electrode above another electrically conductive structure by a first dielectric filling layer, a shape of an uppermost surface of the bottom electrode including a semi-circular shape. The memory device further includes a resistive random-access memory pillar disposed above the bottom electrode.

According to another embodiment of the present disclosure, a memory device includes a plurality of electrically conductive structures embedded in an interconnect dielectric material layer, a bottom electrode selectively grown over, and electrically connected to, each of the electrically conductive structures, the bottom electrode above an electrically conductive structure being separated from the bottom electrode above another electrically conductive structure by a first dielectric filling layer, a shape of an uppermost surface of the bottom electrode including a semi-circular shape. The memory device further includes a resistive random-access memory pillar disposed above the bottom electrode, a second dielectric filling layer dispose above the first dielectric filling layer and above the resistive random-access memory pillar, and a top metal contact electrically connected to the resistive random-access memory pillar.

According to yet another embodiment of the present disclosure, a method of forming a memory device includes forming a plurality of electrically conductive structures within an interconnect dielectric material layer, selectively growing a bottom electrode above each of the electrically conductive structures, a shape of an uppermost surface of the bottom electrode including a semi-circular shape, forming a first dielectric filling layer above the interconnect dielectric material layer and the bottom electrode on each of the electrically conductive structures, conducting a planarization process until exposing the uppermost surface of the bottom electrode, and forming a resistive random-access memory stack above the exposed uppermost surface of the bottom electrode and the first dielectric filling layer.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
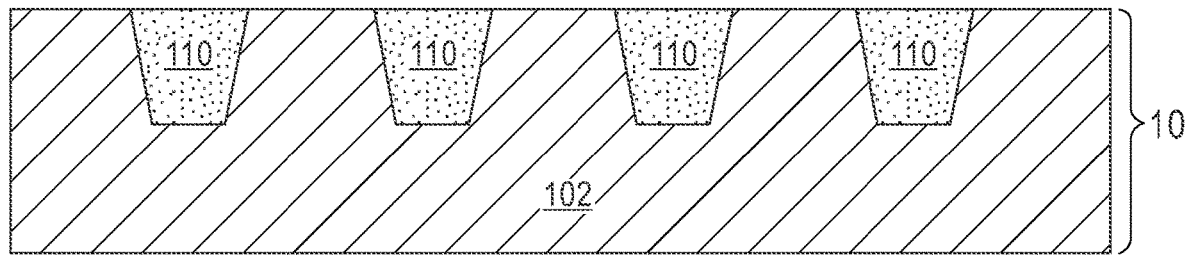
FIG. 1 a cross-sectional view of a memory device at an intermediate step during a semiconductor manufacturing process, according to an embodiment of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Typical bottom contact formation in RRAM relies on patterning a dielectric layer to form a via that extends through the dielectric layer until the underlying bottom wiring level, and then filling the via with a metal (e.g., TaN, or TiN). However, in the manufacturing of high-density RRAM arrays (<100 nm pitch), typical bottom contact formation techniques can cause misalignment and pinch-off during contact metal filling which make such conventional approaches difficult to implement.

Therefore, embodiments of the present disclosure provide a memory device in which a self-aligned bottom electrode is formed using a selective deposition method that can reduce or eliminate misalignment and pinch-off during metal filling in tight-pitch (i.e., a distance between adjacent resistive random-access memory pillars is less than 100 nm) and reduced critical dimension (CD) configurations. Additionally, by selectively growing the bottom electrode contact, a level of patterning can be eliminated thereby simplifying the manufacturing process and scalability of dense RRAM arrays with tight-pitch and reduced CD.

An embodiment by which the self-aligned bottom electrode can be formed is described in detailed below by referring to the accompanying drawings in FIGS. 1-7.

Referring now to FIG. 1, a cross-sectional view of a memory device 100 at an intermediate step during a semiconductor manufacturing process is shown, according to an embodiment of the present disclosure.

In this embodiment, the memory device 100 may be, for example, an RRAM device. The memory device 100 may include an electrically conductive structure 110 (hereinafter "conductive structure") that is embedded in an interconnect dielectric material layer 102. In some embodiments, the conductive structure 110 may further include a diffusion barrier liner (not shown). Collectively, the conductive structure 110 and the interconnect dielectric material layer 102 provide an interconnect level 10. As known by those skilled in the art, at least one other interconnect level and/or a middle-of-the-line (MOL) level may be located beneath the interconnect level 10 formed by the interconnect dielectric material layer 102 and the conductive structure 110. These other levels can be, for example, a metal layer (not shown) including contacts and vias, and a front-end-of-the-line (FEOL) layer (not shown) including one or more transistors.

The interconnect dielectric material layer 102 can be composed of any interconnect dielectric material including, for example, silicon dioxide, silsesquioxanes, C doped oxides (i.e., organosilicates) that includes atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The conductive structure 110 is composed of an electrically conductive metal or metal alloy. Examples of electrically conductive materials that may be used in the present application include copper (Cu), aluminum (Al), tungsten (W), or Cobalt (Co) while an example of an electrically conductive metal alloy is a Cu—Al alloy.

In embodiments in which the diffusion barrier liner (not shown) is part of the conductive structure 108, the diffusion barrier liner is composed of a diffusion barrier material (i.e., a material that serves as a barrier to prevent a conductive material such as copper from diffusing there through). Examples of diffusion barrier materials that can be used in providing the diffusion barrier liner (not shown) may include, but are not limited to, Ta, TaN, Ti, TiN, Ru, RuN, RuTa, RuTaN, W, or WN. In some embodiments, the diffusion barrier liner (not shown) may include a material stack of diffusion barrier materials. In one example, the diffusion barrier material may be composed of a stack of Ta/TaN.

The interconnect level 10 including the interconnect dielectric material layer 102 and the conductive structure 110 may be formed utilizing conventional processes that are well-known to those skilled in the art including, for example, a damascene process. So as not to obscure the method of the present application, the techniques used to form the interconnect level 10 are not provided herein.

Figure 2:
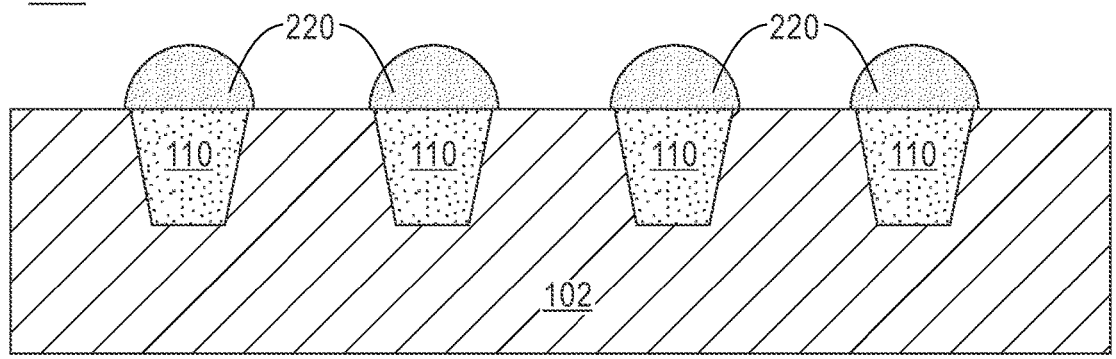
FIG. 2 is a cross-sectional view of the memory device after forming a bottom electrode, according to an embodiment of the present disclosure.

Referring now to FIG. 2, a cross-sectional view of the memory device 100 is shown after forming a bottom electrode 220, according to an embodiment of the present disclosure.

The bottom electrode 220 is formed above the conductive structure 110, as depicted in the figure. The bottom electrode 220 may be formed by depositing a conductive metal film such as, for example, Ta, TaN, Ti, TiN, Ru, RuN, RuTa, RuTaN, Co, CoWP, CoN, W, WN or any combination thereof. In this embodiment, the conductive metal film forming the bottom electrode 220 is selectively grown above the conductive structure 110 using any suitable selective deposition method. Exemplary deposition methods to selectively grow the conductive metal film and form the bottom electrode 220 may include atomic layer deposition (ALD), chemical vapor deposition (CVD), and the like.

According to an embodiment, a (vertical) thickness of the bottom electrode 220 may vary between approximately 10 nm and approximately 50 nm, and ranges therebetween. It should be noted that lateral overgrowth of the conductive material forming the bottom electrode 220 (e.g., outside the conductive structure 110) is proportional to a vertical thickness of the conductive material forming the bottom electrode 220. Thus, the lateral overgrowth can be controlled by adjusting the vertical thickness of the deposited conductive material. In embodiments in which an ALD process is conducted to form the bottom electrode 220, the lateral overgrowth can be restricted by controlling the ALD cycle time.

Thus, by using a selective deposition process to form the bottom electrode 220, misalignment and pinch-off during metal filling can be substantially reduced in tight-pitch (<100 nm) and smaller CD structures. Further, by selectively growing the bottom electrode 220 above the conductive structure 110, a level of patterning is eliminated which can simplify the manufacturing process of the memory device 100 reducing costs. This may also eliminate the need of etching the bottom electrode while forming the RRAM pillar which can be challenging for tight-pitch RRAM pillar arrays due to high aspect ratio. As can be observed in the figure, a shape of an uppermost surface or top portion of the bottom electrode 220 includes a semi-circular, umbrella-like or mushroom-like shape. The mushroom-shaped top of the bottom electrode 220 is characteristic of the selective growth technique used to form the conductive metal film forming the bottom electrode 220 (hereinafter also referred to as "mushroom-shaped bottom electrode").

Figure 3:
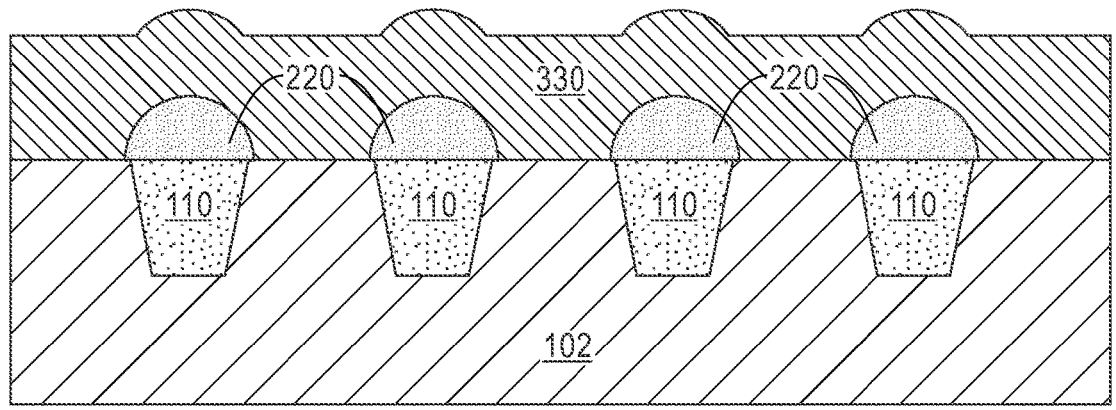
FIG. 3 is cross-sectional view of the memory device after forming a first dielectric filling layer, according to an embodiment of the present disclosure.

Referring now to FIG. 3, a cross-sectional view of the memory device 100 is shown after forming a first dielectric filling layer 330, according to an embodiment of the present disclosure. Any suitable deposition process can be used to form the dielectric filling layer 330 in the memory device 100. The dielectric filling layer 330 may be made of analogous materials and formed in similar ways as the interconnect dielectric material layer 102.

Figure 4:
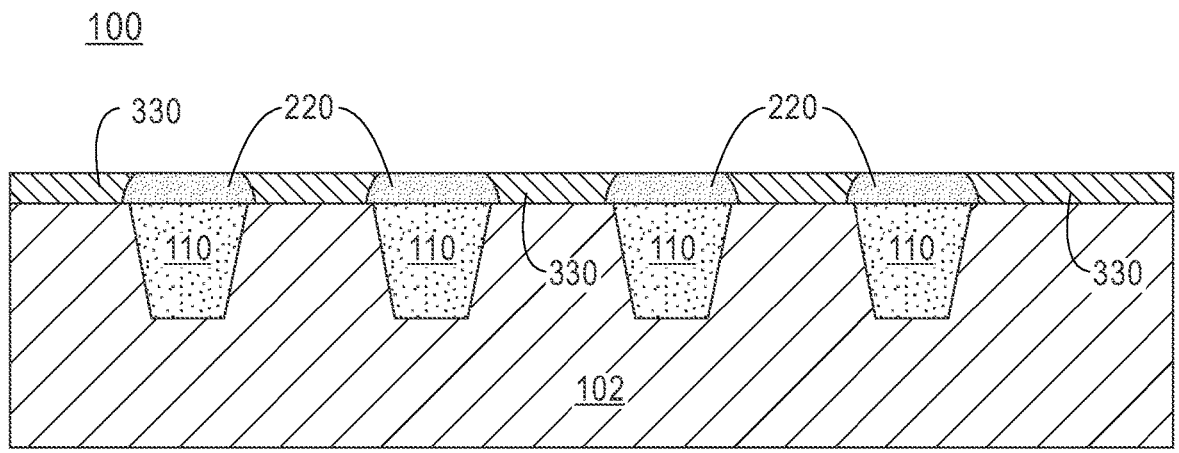
FIG. 4 is a cross-sectional view of the memory device after conducting a planarization process, according to an embodiment of the present disclosure.

Referring now to FIG. 4, a cross-sectional view of the memory device 100 is shown after conducting a planarization process, according to an embodiment of the present disclosure. After deposition of the dielectric filling layer 330, a planarization process may be conducted on the memory device 100. Specifically, in this embodiment, a chemical mechanical polishing (CMP) process is conducted on the memory device 100. The CMP process stops at an uppermost surface of the bottom electrode 220 (i.e., after exposing the uppermost surface of the bottom electrode 220).

Figure 5:
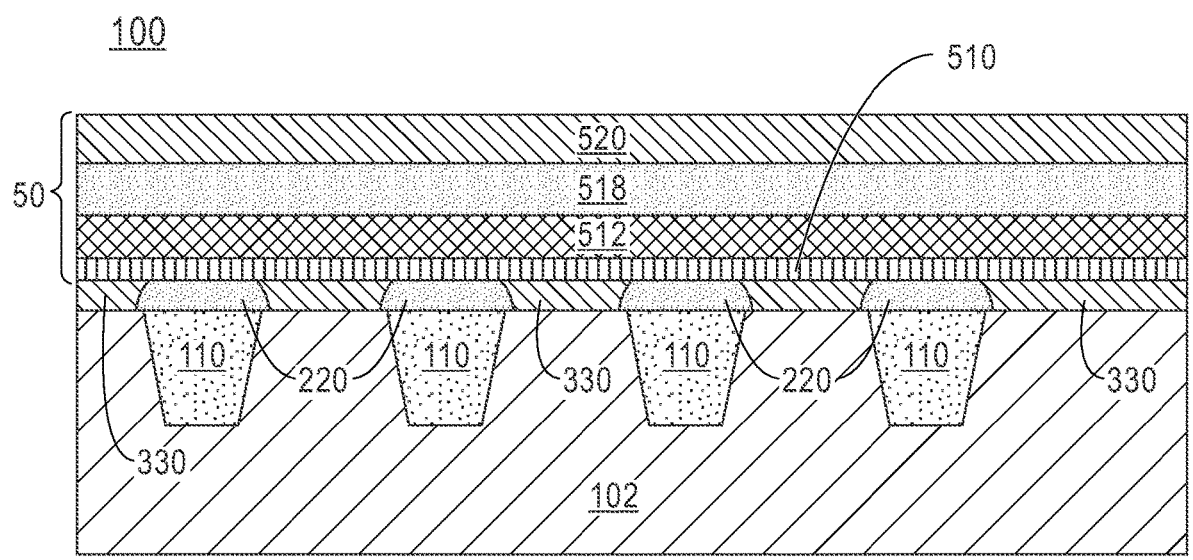
FIG. 5 is a cross-sectional view of the memory device after forming a resistive random-access memory stack, according to an embodiment of the present disclosure.

Referring now to FIG. 5, a cross-sectional view of the memory device 100 is shown after forming an RRAM stack 50, according to an embodiment of the present disclosure.

In this embodiment, the simplistically depicted RRAM stack 50 may consist of an oxide layer 510, an electrode layer 512 disposed above the oxide layer 510, a first hardmask layer 518 disposed above the electrode layer 512, and a second hardmask layer 520 disposed above the first hardmask layer 518.

The oxide layer 510 may be conformally deposited using suitable deposition techniques such as, for example, ALD. The oxide layer 510 may be made of a metal oxide material or high-k materials. Non-limiting examples of suitable materials for the oxide layer 510 may include titanium oxide, tantalum oxide, and hafnium oxide. The oxide layer 510 serves as a dielectric layer for RRAM structure, separating the bottom electrode 220 from the electrode layer 512. In an embodiment, the oxide layer 510 may have a thickness varying from approximately 1 nm to approximately 20 nm.

The electrode layer 512 is conformally deposited on top of the oxide layer 510. The electrode layer 512 may be deposited using suitable deposition techniques including, but not limited to, ALD. The electrode layer 512 may be made of materials such as titanium nitride and/or aluminum doped titanium nitride. It should be noted that, the electrode layer 512 serves as a top electrode for the memory device 100. In an embodiment, the electrode layer 512 may have a thickness varying from approximately 10 nm to approximately 100 nm.

With continued reference to FIG. 5, the first hardmask layer 518 is formed above the electrode layer 512. The first hardmask layer 518 includes a metallic hardmask typically required to protect the RRAM stack 50 during subsequent etching steps. In an exemplary embodiment, the first hardmask layer 518 may be composed of metals such as TaN, WN, and TiN. The second hardmask layer 520 formed above the first hardmask layer 518 can be made of a dielectric material (e.g., silicon dioxide, silicon nitride, silicon carbide, and the like) and/or multiple layers of dielectric materials.

According to an embodiment, the first hardmask layer 518 and the second hardmask layer 520 can be formed by any suitable deposition method known in the art. Exemplary deposition techniques to form the first and second hardmask layers 518, 520 may include PVD, CVD, ALD, and the like. In some embodiments, the first and second hardmask layers 518, 520 can be referred to collectively as a bi-layer hardmask that remains on the memory device 100. In an embodiment, a thickness of the first hardmask layer 518 can vary between approximately 10 nm to approximately 100 nm, while a thickness of the second hardmask layer 520 can vary between approximately 10 nm to approximately 100 nm.

Figure 6:
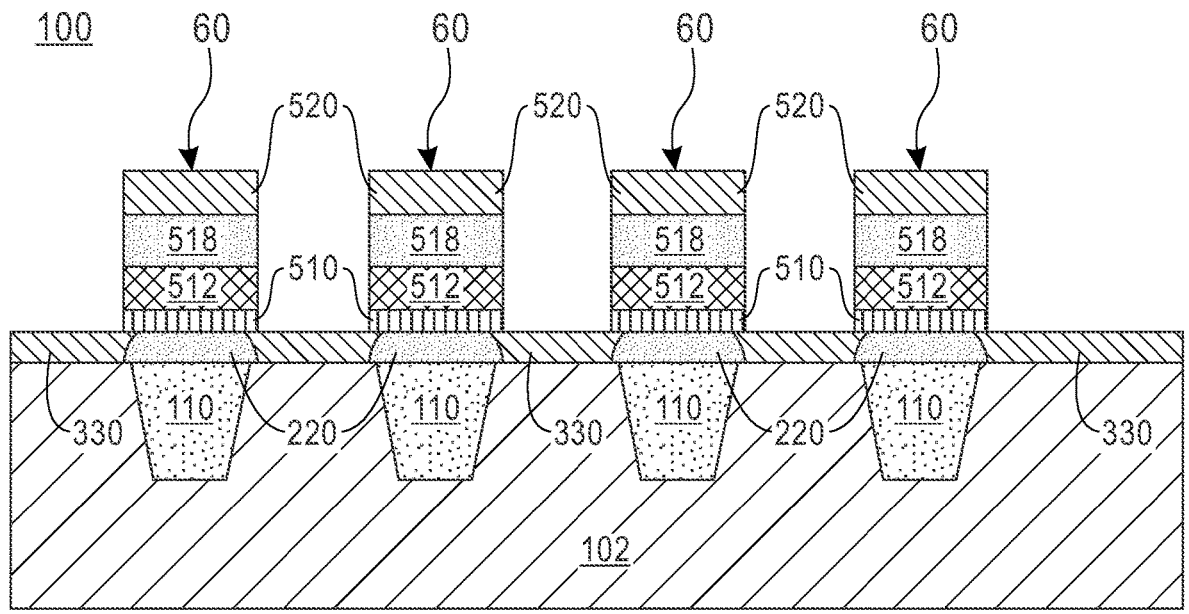
FIG. 6 is a cross-sectional view of the memory device after patterning the resistive random-access memory stack and forming resistive random-access memory pillars, according to an embodiment of the present disclosure.

Referring now to FIG. 6, a cross-sectional view of the memory device 100 is shown after patterning the RRAM stack 50 (FIG. 5) and forming RRAM pillars 60, according to an embodiment of the present disclosure.

The process of patterning the RRAM stack 50 (FIG. 5) consists of steps well-known in the art, which generally include forming a pattern on a photoresist layer (not shown) that is transferred to the second hardmask layer 520 and used to pattern the RRAM pillars 60 via any suitable etching technique. In an exemplary embodiment, an ion beam etch (IBE) or reactive ion etch (RIE) technique may be used to pattern the RRAM pillars 60. Patterning of the RRAM stack 50 (FIG. 5) to form the RRAM pillars 60 exposes an uppermost surface of the first dielectric filling layer 330, as depicted in the figure.

Figure 7:
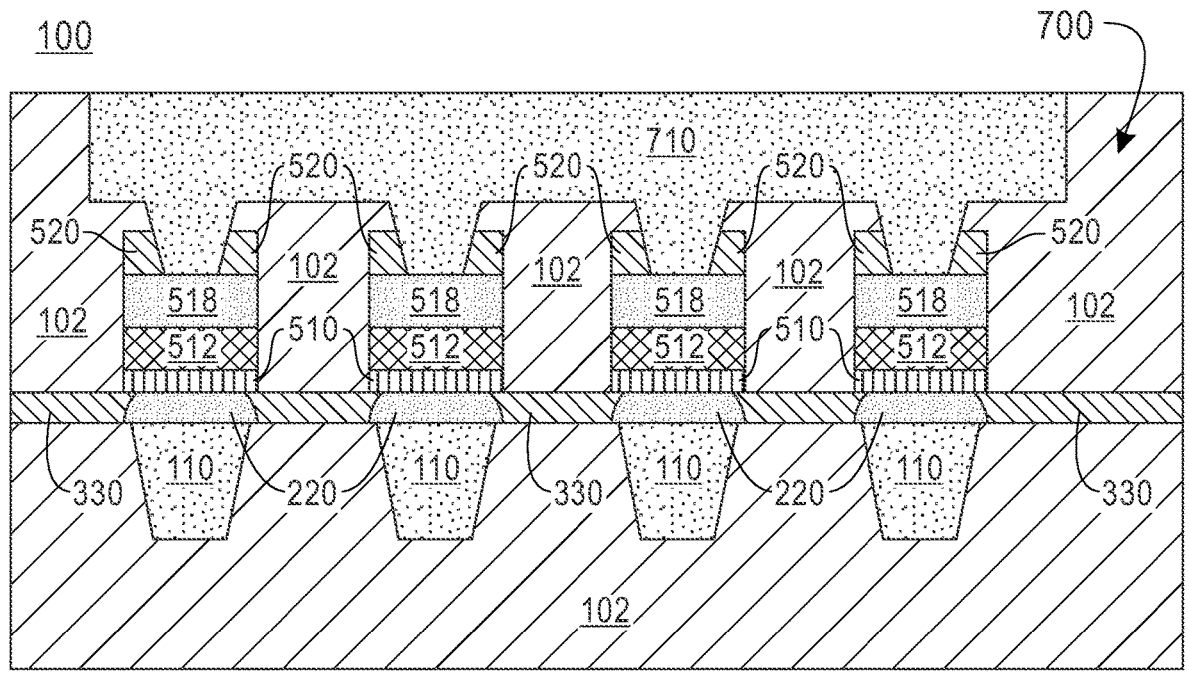
FIG. 7 is a cross-sectional view of the memory device after contact metallization, according to an embodiment of the present disclosure.

Referring now to FIG. 7, a cross-sectional view of the memory device 100 is shown after contact metallization, according to an embodiment of the present disclosure.

In this embodiment, a second dielectric filling layer 700 is formed on the memory device 100 in preparation for device contact formation. Any suitable deposition process can be used to form the second dielectric filling layer 700 in the memory device 100 such as, for example, CVD of a dielectric material. Non-limiting examples of dielectric materials to form the second dielectric filling layer 700 may include silicon oxide, silicon nitride, hydrogenated silicon carbon oxide, silicon based low-k dielectrics, flowable oxides, porous dielectrics, or organic dielectrics including porous organic dielectrics. In some embodiments, a planarization process may be conducted on the memory device 100 after deposition of the second dielectric filling layer 700.

After deposition of the second dielectric filling layer 700, a photoresist layer (not shown) is formed above the dielectric filling layer 700 for forming contact trenches (not shown) using well-known lithography and reactive ion etch (RIE) processing. As known by those skilled in the art, patterning of the second dielectric filling layer 700 to form the contact trenches involves exposing a pattern (not shown) on the photoresist layer and transferring the exposed pattern to the second dielectric filling layer 700. After transferring the pattern and forming the contact trenches, the photoresist layer can be removed using any photoresist striping method known in the art including, for example, plasma ashing.

Subsequently, the patterned contact trenches are filled with a conductive material or a combination of conductive materials to form metal contacts 710. The conductive material filling the metal contacts 710 includes a conductive metal, for example, aluminum (Al), platinum (Pt), gold (Au), tungsten (W), titanium (Ti), cobalt (Co), ruthenium (Ru), copper (Cu), or any combination thereof. It should be noted that, in some embodiments, an adhesion metal liner (not shown) may be used before conductive metal depth, such as TiN, TaN, etc. The conductive material may be deposited by a suitable deposition process, for example, CVD, PECVD, PVD, plating, thermal or e-beam evaporation, or sputtering. A planarization process such as CMP is generally performed to remove any conductive material from surfaces of the memory device 100.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Spatially relative terms, such as "inner," "outer," "beneath," "below," "lower," "above," "upper," "top," "bottom," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory device, comprising:
   a plurality of electrically conductive structures embedded in an interconnect dielectric material layer;
   a bottom electrode selectively grown over, and electrically connected to, each of the electrically conductive structures, wherein the bottom electrode above an electrically conductive structure is separated from the bottom electrode above another electrically conductive structure by a first dielectric filling layer, a shape of an uppermost surface of the bottom electrode including a semi-circular shape; and
   a resistive random-access memory pillar disposed above the bottom electrode.

2. The memory device of claim 1, further comprising:
   a second dielectric filling layer disposed above the first dielectric filling layer and above the resistive random-access memory pillar above the bottom electrode on each of the electrically conductive structures; and
   a top metal contact electrically connected to the resistive random-access memory pillar.

3. The memory device of claim 1, wherein the selectively grown bottom electrode comprises a conductive metal film including tantalum nitride.

4. The memory device of claim 1, wherein a distance between adjacent resistive random-access memory pillars is less than 100 nm.

5. The memory device of claim 1, wherein the resistive random-access memory pillar further comprises:
   an oxide layer above the bottom electrode;
   an electrode layer above the oxide layer;
   a first hardmask layer above the electrode layer; and
   a second hardmask layer above the first hardmask layer.

6. The memory device of claim 1, wherein the plurality of conductive structures and the interconnect dielectric material layer provide an interconnect level that is above at least one other interconnect level.

7. A memory device, comprising:
   a plurality of electrically conductive structures embedded in an interconnect dielectric material layer;
   a bottom electrode selectively grown over, and electrically connected to, each of the electrically conductive structures, wherein the bottom electrode above an electrically conductive structure is separated from the bottom electrode above another electrically conductive structure by a first dielectric filling layer, a shape of an uppermost surface of the bottom electrode including a semi-circular shape;
   a resistive random-access memory pillar disposed above the bottom electrode;
   a second dielectric filling layer dispose above the first dielectric filling layer and above the resistive random-access memory pillar; and
   a top metal contact electrically connected to the resistive random-access memory pillar.

8. The memory device of claim 7, wherein the selectively grown bottom electrode comprises a conductive metal film including tantalum nitride.

9. The memory device of claim 7, wherein a distance between adjacent resistive random-access memory pillars is less than 100 nm.

10. The memory device of claim 7, wherein the resistive random-access memory pillar further comprises:
an oxide layer above the bottom electrode;
an electrode layer above the oxide layer;
a first hardmask layer above the electrode layer; and
a second hardmask layer above the first hardmask layer.

11. The memory device of claim 7, wherein the plurality of conductive structures and the interconnect dielectric material layer provide an interconnect level that is above at least one other interconnect level.

12. A method of forming a memory device, comprising:
forming a plurality of electrically conductive structures within an interconnect dielectric material layer;
selectively growing a bottom electrode above each of the electrically conductive structures, a shape of an uppermost surface of the bottom electrode including a semicircular shape;
forming a first dielectric filling layer above the interconnect dielectric material layer and the bottom electrode on each of the electrically conductive structures;
conducting a planarization process until the uppermost surface of the bottom electrode is exposed; and
forming a resistive random-access memory stack above the exposed uppermost surface of the bottom electrode and the first dielectric filling layer.

13. The method of claim 12, wherein the selectively grown bottom electrode comprises a first conductive metal film including tantalum nitride.

14. The method of claim 12, further comprising:
patterning the resistive random-access memory stack to form a resistive random-access memory pillar above the bottom electrode.

15. The method of claim 12, wherein the resistive random-access memory stack comprises:
an oxide layer above the bottom electrode;
an electrode layer above the oxide layer;
a first hardmask layer above the electrode layer; and
a second hardmask layer above the first hardmask layer.

16. The method of claim 14, further comprising:
forming a second dielectric filling layer dispose above the first dielectric filling layer and above the resistive random-access memory pillar.

17. The method of claim 16, further comprising:
patterning the second dielectric filling layer to form contact trenches; and
filling the contact trenches with a second conductive material to form top contacts to the resistive random-access memory pillar.

18. The method of claim 14, wherein a distance between adjacent resistive random-access memory pillars is less than 100 nm.

19. The method of claim 12, wherein the plurality of conductive structures and the interconnect dielectric material layer provide an interconnect level that is above at least one other interconnect level.

* * * * *